United States Patent
Davlantes

(10) Patent No.: US 11,211,826 B2
(45) Date of Patent: Dec. 28, 2021

(54) SYSTEM AND METHOD FOR WIRELESS POWER RECEPTION

(71) Applicant: Supply, Inc., Emeryville, CA (US)

(72) Inventor: Christopher Joseph Davlantes, Oakland, CA (US)

(73) Assignee: Supply, Inc., Emeryville, CA (US)

( * ) Notice: Subject to any disclaimer, the term of this patent is extended or adjusted under 35 U.S.C. 154(b) by 0 days.

(21) Appl. No.: 17/015,473

(22) Filed: Sep. 9, 2020

(65) Prior Publication Data

US 2020/0403451 A1 Dec. 24, 2020

Related U.S. Application Data

(63) Continuation of application No. 16/001,628, filed on Jun. 6, 2018, now Pat. No. 10,811,908, which is a
(Continued)

(51) Int. Cl.
| | |
|---|---|
| *H02J 50/20* | (2016.01) |
| *H02J 50/12* | (2016.01) |
| *G01R 31/28* | (2006.01) |
| *H02J 50/05* | (2016.01) |
| *H02J 7/00* | (2006.01) |

(Continued)

(52) U.S. Cl.
CPC .......... *H02J 50/12* (2016.02); *G01R 31/2822* (2013.01); *H02J 50/05* (2016.02); *H02J 50/20* (2016.02); *H02J 7/007* (2013.01); *H02J 7/025* (2013.01); *H02J 50/27* (2016.02)

(58) Field of Classification Search
CPC .. H02J 50/12; H02J 50/20; H02J 50/05; H02J 7/007; H02J 7/025; H02J 50/27; G01R 31/2822
See application file for complete search history.

(56) References Cited

U.S. PATENT DOCUMENTS

| | | |
|---|---|---|
| 6,967,462 B1 | 11/2005 | Landis |
| 7,144,922 B2 | 12/2006 | Demssie et al. |

(Continued)

FOREIGN PATENT DOCUMENTS

| | | |
|---|---|---|
| CN | 104702105 A | 6/2015 |
| JP | 2003108972 A | 4/2003 |

(Continued)

OTHER PUBLICATIONS

Kumar, et al., "Memetic search in differential evolution algorithm." In:arXiv preprint. Aug 1, 2014 Retreived from <https://arxiv.org/ftp/arxiv/papers/1408/1408.0101.pdf> entire document.
(Continued)

*Primary Examiner* — Daniel Cavallari
(74) *Attorney, Agent, or Firm* — Jeffrey Schox; Samuel Rosenthal

(57) ABSTRACT

A system for wireless power reception, preferably including one or more: antennas, dynamic impedance matches, RF-DC converters, DC impedance converters, and/or DC power outputs. A method for wireless power reception, preferably including: receiving power wirelessly at an antenna, dynamically adjusting an input impedance of a dynamic impedance match coupled to the antenna, and/or delivering the power to a load.

21 Claims, 10 Drawing Sheets

Related U.S. Application Data continuation-in-part of application No. 14/865,489, filed on Sep. 25, 2015, now Pat. No. 10,090,707.

(60) Provisional application No. 62/055,283, filed on Sep. 25, 2014, provisional application No. 62/515,962, filed on Jun. 6, 2017.

(51) Int. Cl.
*H02J 7/02* (2016.01)
*H02J 50/27* (2016.01)

(56) References Cited

U.S. PATENT DOCUMENTS

| | | |
|---|---|---|
| 7,424,058 B1 | 9/2008 | Staley et al. |
| 7,502,340 B1 | 3/2009 | Chuang et al. |
| 8,134,516 B1 | 3/2012 | Yaghjian et al. |
| 8,159,364 B2 | 4/2012 | Zeine |
| 8,175,660 B2 | 5/2012 | Porwal |
| 8,180,286 B2 | 5/2012 | Yamasuge |
| 8,338,991 B2 | 12/2012 | Von Novak et al. |
| 8,650,418 B2 | 2/2014 | Wu |
| 8,682,318 B2 | 3/2014 | Lee et al. |
| 8,766,544 B2 | 7/2014 | Velazquez |
| 8,772,967 B1 | 7/2014 | Ikriannikov et al. |
| 9,142,990 B2 | 9/2015 | Keeling et al. |
| 9,288,769 B2 | 3/2016 | Tandai et al. |
| 9,368,020 B1 | 6/2016 | Bell et al. |
| 9,425,629 B2 | 8/2016 | Kim et al. |
| 9,544,004 B2 | 1/2017 | Callaway et al. |
| 9,547,099 B2 | 1/2017 | Shih |
| 9,608,454 B2 | 3/2017 | Sankar |
| 9,622,195 B2 | 4/2017 | Ko et al. |
| 9,711,978 B2 | 7/2017 | Manova-Elssibony et al. |
| 9,853,486 B2 | 12/2017 | Liu et al. |
| 9,859,757 B1 | 1/2018 | Leabman et al. |
| 9,876,380 B1 | 1/2018 | Leabman et al. |
| 9,882,427 B2 | 1/2018 | Leabman et al. |
| 9,893,555 B1 | 2/2018 | Leabman et al. |
| 9,967,462 B2 | 5/2018 | Kimura et al. |
| 10,021,523 B2 | 7/2018 | Leabman |
| 10,069,592 B1 | 9/2018 | Krunz et al. |
| 10,135,257 B1 | 11/2018 | Adolf et al. |
| 10,148,320 B2 | 12/2018 | Shin et al. |
| 10,193,390 B2 | 1/2019 | Riehl |
| 10,199,849 B1 | 2/2019 | Bell et al. |
| 2002/0111905 A1 | 8/2002 | Nagafuchi et al. |
| 2004/0203846 A1 | 10/2004 | Caronni et al. |
| 2005/0090287 A1 | 4/2005 | Rofougaran |
| 2005/0170788 A1 | 8/2005 | Tanaka et al. |
| 2006/0088123 A1 | 4/2006 | Jensen et al. |
| 2007/0155347 A1 | 7/2007 | Heuermann et al. |
| 2007/0156343 A1 | 7/2007 | Rayan et al. |
| 2007/0210899 A1 | 9/2007 | Kato et al. |
| 2007/0243851 A1 | 10/2007 | Shoarinejad et al. |
| 2008/0057880 A1 | 3/2008 | Copeland |
| 2008/0225639 A1 | 9/2008 | Hongou |
| 2009/0210366 A1 | 8/2009 | Sakata et al. |
| 2009/0284082 A1 | 11/2009 | Mohammadian |
| 2010/0033021 A1 | 2/2010 | Bennett |
| 2010/0222010 A1 | 9/2010 | Ozaki et al. |
| 2010/0226448 A1 | 9/2010 | Dent |
| 2011/0141148 A1 | 6/2011 | Hill et al. |
| 2011/0148215 A1 | 6/2011 | Marzetta et al. |
| 2011/0156640 A1 | 6/2011 | Moshfeghi |
| 2011/0216564 A1 | 9/2011 | Swamy |
| 2011/0224817 A1 | 9/2011 | Dubrov et al. |
| 2011/0281535 A1 | 11/2011 | Low et al. |
| 2011/0282535 A1 | 11/2011 | Woody et al. |
| 2012/0109606 A1 | 5/2012 | Dotan et al. |
| 2012/0146425 A1 | 6/2012 | Lee et al. |
| 2012/0217818 A1 | 8/2012 | Yerazunis et al. |
| 2012/0218799 A1* | 8/2012 | Furukawa .......... H02J 50/40 363/126 |
| 2012/0300592 A1 | 11/2012 | Perry |
| 2012/0313450 A1 | 12/2012 | Nam et al. |
| 2012/0326660 A1 | 12/2012 | Lu et al. |
| 2013/0043734 A1 | 2/2013 | Stone et al. |
| 2013/0057078 A1 | 3/2013 | Lee et al. |
| 2013/0066471 A1 | 3/2013 | Wang et al. |
| 2013/0102345 A1 | 4/2013 | Jung |
| 2013/0113299 A1 | 5/2013 | Von Novak et al. |
| 2013/0288595 A1 | 10/2013 | Lee et al. |
| 2014/0028110 A1 | 1/2014 | Petersen et al. |
| 2014/0028111 A1 | 1/2014 | Hansen et al. |
| 2014/0062395 A1 | 3/2014 | Kwon et al. |
| 2014/0070621 A9 | 3/2014 | Von Novak et al. |
| 2014/0106761 A1 | 4/2014 | Lee et al. |
| 2014/0133322 A1 | 5/2014 | Steer et al. |
| 2014/0139034 A1 | 5/2014 | Sankar et al. |
| 2014/0203769 A1 | 7/2014 | Keeling et al. |
| 2014/0214743 A1 | 7/2014 | Chester et al. |
| 2014/0227981 A1 | 8/2014 | Pecen et al. |
| 2014/0239305 A1 | 8/2014 | Shah et al. |
| 2014/0242918 A1 | 8/2014 | Weissman et al. |
| 2014/0361741 A1 | 12/2014 | Von Novak, III et al. |
| 2014/0375253 A1 | 12/2014 | Leabman et al. |
| 2015/0022009 A1 | 1/2015 | Leabman et al. |
| 2015/0123496 A1 | 5/2015 | Leabman et al. |
| 2015/0181539 A1 | 6/2015 | Aiba et al. |
| 2015/0280444 A1 | 10/2015 | Smith et al. |
| 2015/0326061 A1 | 11/2015 | Davison et al. |
| 2015/0349542 A1 | 12/2015 | Yamamoto et al. |
| 2015/0351054 A1 | 12/2015 | Immonen et al. |
| 2015/0357827 A1 | 12/2015 | Muratov et al. |
| 2015/0371771 A1 | 12/2015 | Abu Qahouq |
| 2016/0013656 A1 | 1/2016 | Bell et al. |
| 2016/0026625 A1 | 1/2016 | Walker |
| 2016/0054395 A1 | 2/2016 | Bell et al. |
| 2016/0054396 A1 | 2/2016 | Bell et al. |
| 2016/0056966 A1 | 2/2016 | Bell |
| 2016/0087686 A1 | 3/2016 | Won et al. |
| 2016/0094092 A1 | 3/2016 | Davlantes et al. |
| 2016/0099611 A1 | 4/2016 | Leabman et al. |
| 2016/0099613 A1 | 4/2016 | Bell et al. |
| 2016/0099755 A1 | 4/2016 | Leabman et al. |
| 2016/0099758 A1 | 4/2016 | Bell et al. |
| 2016/0140115 A1 | 5/2016 | Walker |
| 2016/0156268 A1 | 6/2016 | Thomas et al. |
| 2016/0165545 A1 | 6/2016 | Ouchi et al. |
| 2016/0197494 A1 | 7/2016 | Kwon et al. |
| 2016/0216301 A1 | 7/2016 | Holzworth et al. |
| 2016/0233724 A1 | 8/2016 | Bae et al. |
| 2016/0337085 A1 | 11/2016 | Yu et al. |
| 2016/0344431 A1 | 11/2016 | Srirattana et al. |
| 2016/0372948 A1 | 12/2016 | Kvols |
| 2016/0379753 A1 | 12/2016 | Jang et al. |
| 2017/0025885 A1 | 1/2017 | Blakely et al. |
| 2017/0077736 A1 | 3/2017 | Leabman |
| 2017/0201289 A1 | 7/2017 | Zhang et al. |
| 2017/0222469 A1 | 8/2017 | Tustin et al. |
| 2017/0261631 A1 | 9/2017 | Donderici et al. |
| 2017/0288738 A1 | 10/2017 | Lee et al. |
| 2017/0366242 A1 | 12/2017 | Lee et al. |
| 2018/0118045 A1 | 5/2018 | Gruzen et al. |
| 2018/0131413 A1 | 5/2018 | Won et al. |
| 2018/0352519 A1 | 12/2018 | Navarro et al. |
| 2019/0296547 A1 | 9/2019 | Kelly et al. |
| 2019/0364492 A1 | 11/2019 | Azizi et al. |

FOREIGN PATENT DOCUMENTS

| | | |
|---|---|---|
| JP | 2009048353 A | 3/2009 |
| JP | 2016111791 A | 6/2016 |
| WO | 2006080304 A1 | 8/2006 |

OTHER PUBLICATIONS

Wang et al. "PROCEED: A Pareto optimization-based circuit-level evaluator for emerging devices." In: IEEE Transactions on Very Large Scale Integration (VLSI) Systems. Feb. 12, 2015.

(56) References Cited

OTHER PUBLICATIONS

Wikipedia contributors. "Power dividers and directional couplers." Wikipedia, The Free Encyclopedia. Wikipedia, The Free Encyclopedia, Mar. 1, 2020. Web. Jun. 5, 2020. (Year: 2020).

Brown, William C., "The history of power transmission by radio waves" IEEE Transactions on microwave theory and techniques 32, No. 9 (1984): 1230-1242.

Harrington, Roger F., "Effect of Antenna Size on Gain, Bandwidth, and Efficiency", Journal of Research of the National Bureau of Standards—D. Radio Propagation vol. 64D, No. 1, Jan.-Feb. 1960., 12 pages.

Ivrlac, Michel T., "High-Efficiency Super-Gain Antenna Arrays", 2010 International ITG Workshop on Smart Antennas (WSA 2010), 369-374.

\* cited by examiner

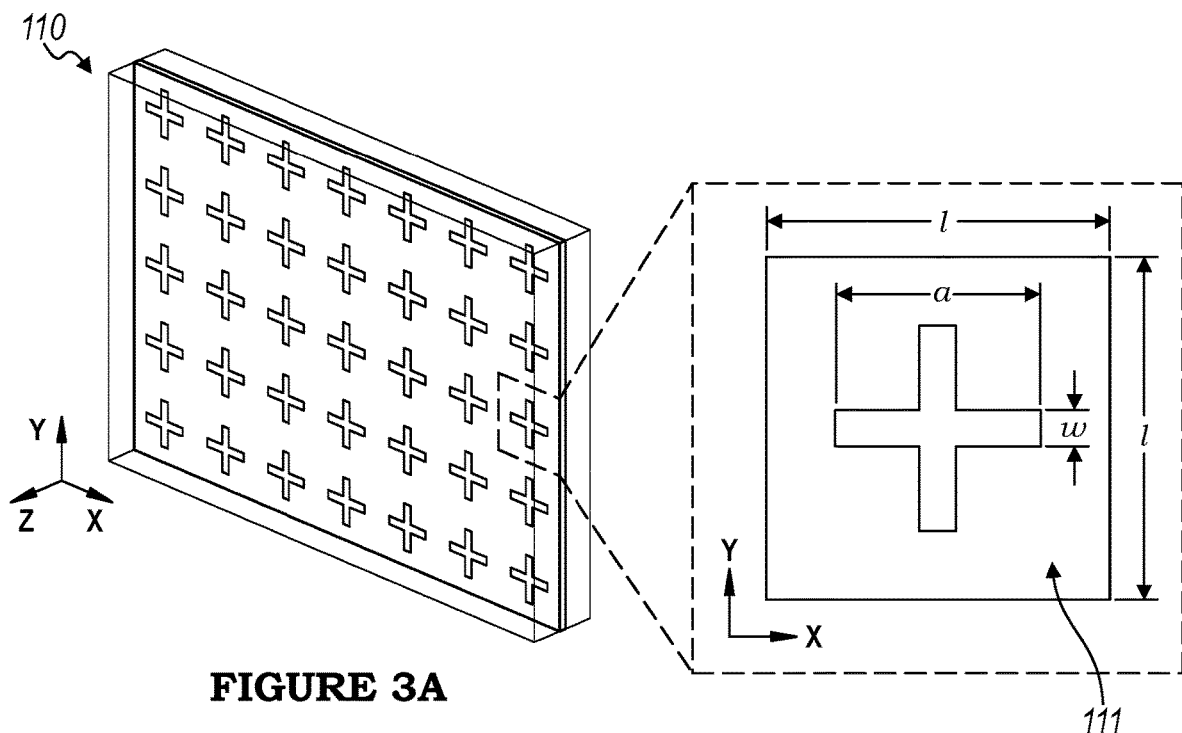
FIGURE 3A
FIGURE 3B
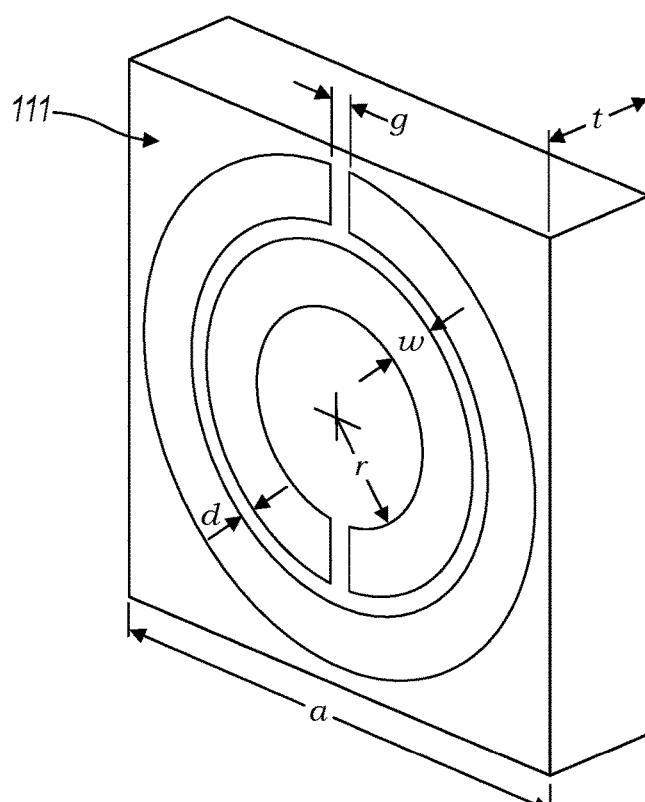
FIGURE 3C

SYSTEM AND METHOD FOR WIRELESS POWER RECEPTION

CROSS-REFERENCE TO RELATED APPLICATIONS

This application is a continuation of U.S. application Ser. No. 16/001,628, filed on 6 Jun. 2018, which claims the benefit of U.S. Provisional Application Ser. No. 62/515,962, filed on 6 Jun. 2017, and also which is a continuation-in-part of U.S. application Ser. No. 14/865,489, filed on 25 Sep. 2015, which claims the benefit of U.S. Provisional Application Ser. No. 62/055,283, filed on 25 Sep. 2014, each of which is incorporated in its entirety by this reference.

TECHNICAL FIELD

This invention relates generally to the wireless power field, and more specifically to a new and useful system and for power reception in the wireless power field.

BACKGROUND

Efficient power reception can be important in wireless power systems. Thus, there is a need in the wireless power field to create an improved system and method for wireless power reception.

BRIEF DESCRIPTION OF THE FIGURES

FIG. 3A is a perspective view of a second example of an antenna.

FIG. 3B is a plan view of a cross resonator of the second example of the antenna.

FIG. 3C is a perspective view of an example of a split-ring resonator.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview.

Figure 1A:
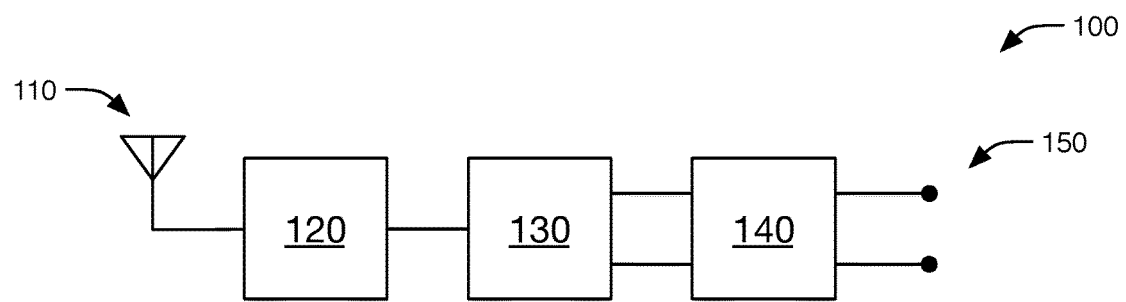
FIGS. 1A-1B are schematic representations of a first and second embodiment, respectively, of the system.

A system 100 for wireless power reception preferably includes one or more antennas no, dynamic impedance matches 120, RF-DC converters 130, DC impedance converters 140, and/or DC power outputs 150 (e.g., as shown in FIG. 1A). The system 100 (e.g., wireless power receiver such as an RF power receiver) preferably functions as a radio-frequency power receiver and preferably receives radio power wirelessly from a radio-frequency power transmitter (e.g., as described in U.S. patent application Ser. No. 14/865,489, filed 25 Sep. 2015, the entirety of which is incorporated by this reference). However, the system 100 can additionally or alternatively include any other suitable elements in any suitable arrangement.

2. Benefits.

The system 100 and/or method can confer several benefits. First, by dynamically tuning the input impedance presented to the antennas, the dynamic impedance match 120 can enable efficient reception of arbitrary RF input fields using arbitrary antennas and/or other RF power sources, and/or can detune the input impedance to limit power reception, which can result in a significant reflection coefficient, thereby potentially enabling other wireless power receivers to receive RF power that would otherwise be received by the system 100. For example, if the antennas are accepting more power than other elements of the system, such as the RF-DC converters, can handle, the dynamic impedance match can detune itself so that this extra power is reflected off of the network and sent back out of the antennas. Second, by dynamically tuning the DC output impedance of the system, the DC impedance converter 140 can enable efficient power provision to arbitrary DC loads and/or enable efficient operation of the RF-DC converter(s). Third, by reducing variance in input current and/or voltage (e.g., variance arising from arbitrary and/or changing RF input fields and/or coupling between antennas), such as variance DC current and voltage output by the RF-DC converters, a parallel-series array of system components can further increase the overall system efficiency. However, the system 100 and/or method can additionally or alternatively confer any other suitable benefits.

3. System.

3.1 Antenna.

The antenna 110 preferably functions to receive power (e.g., electromagnetic radiation transmitted toward the system 100, preferably propagating or "far-field" radiation but additionally or alternatively evanescent or "near-field" radiation) and to couple the received power into the system 100. The antenna 110 preferably includes a tightly-coupled array of resonators in (e.g., as shown in FIG. 3A), but can additionally or alternatively include a loosely-coupled array, a sparse array, a single resonator 111, and/or any other suitable antenna elements.

Figure 2:
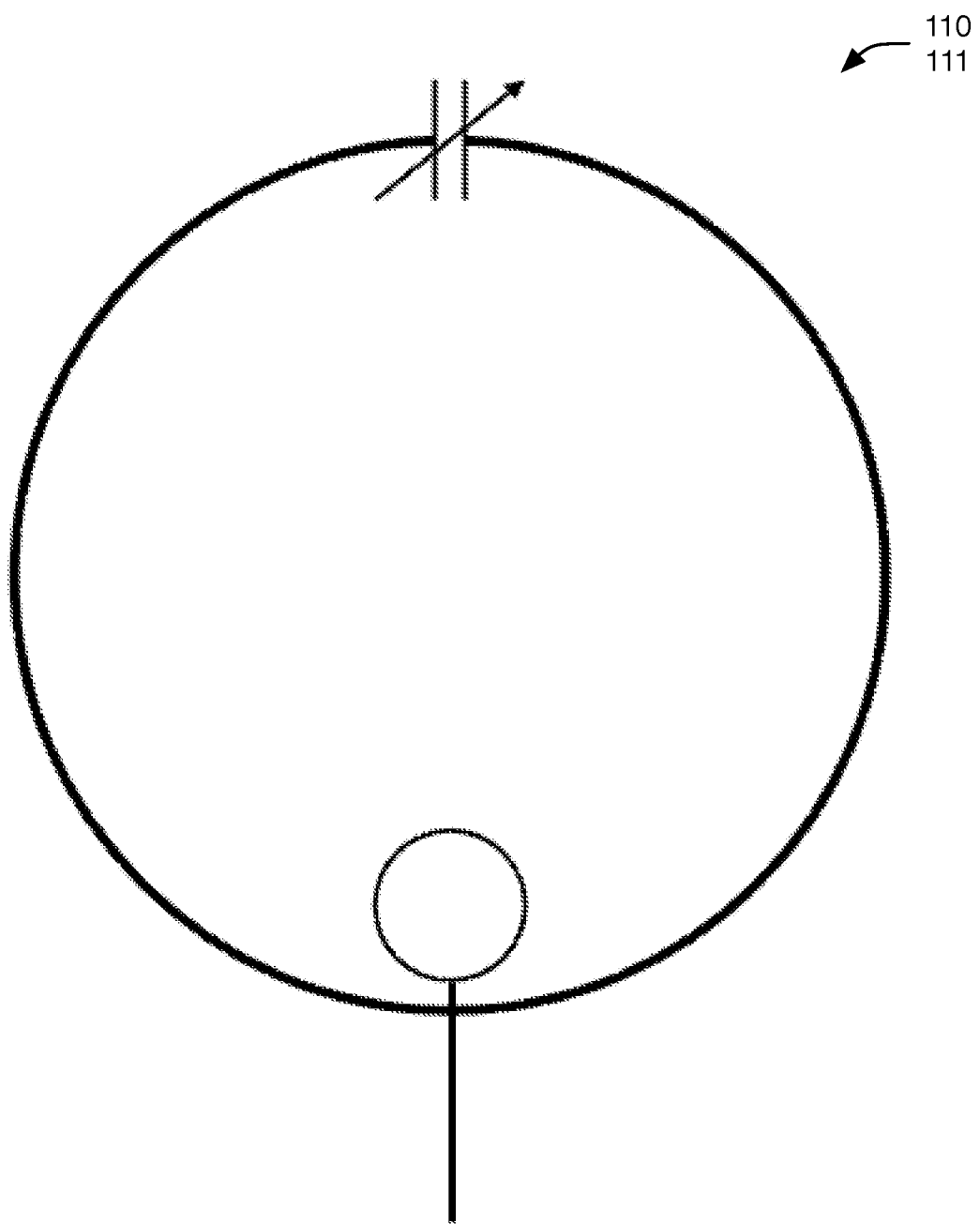
FIG. 2 is a schematic view of a first example of an antenna.
Figure 4A:
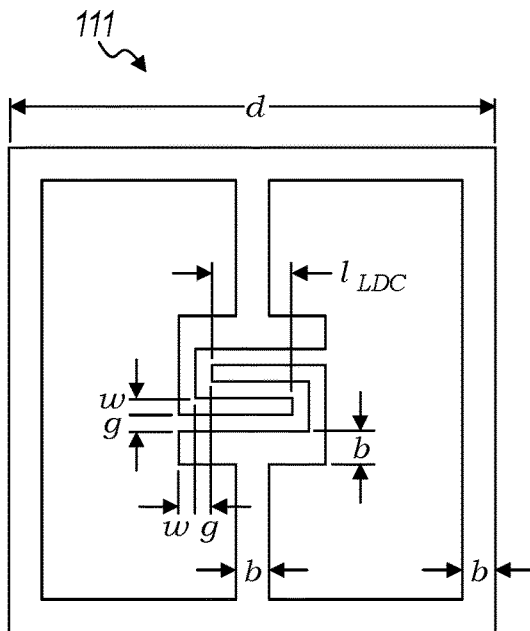
FIGS. 4A-4D are plan views of specific examples of an electro-inductive-capacitive resonator.
Figure 4B:
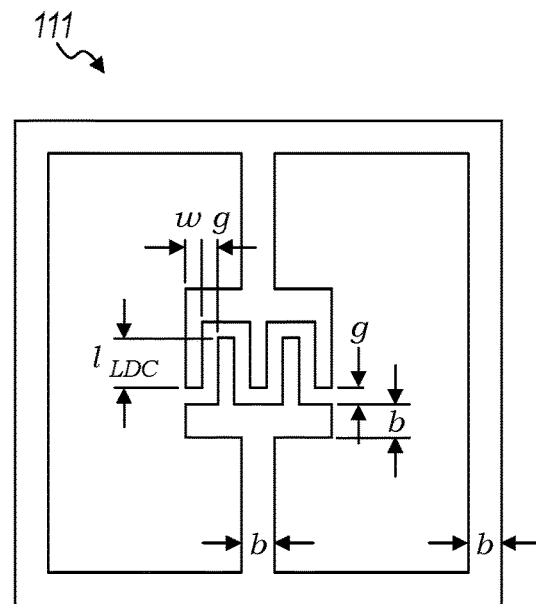
Figure 4C:
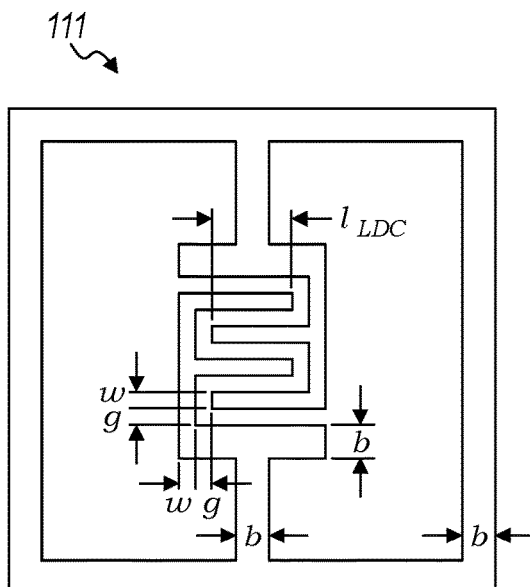
Figure 4D:
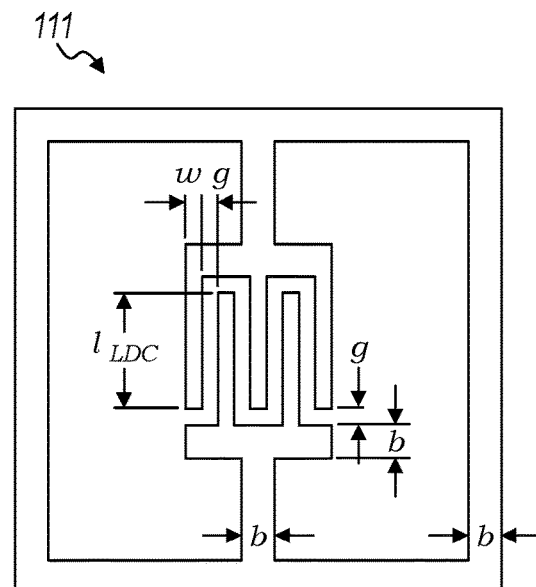

The resonators 111 preferably have a high quality factor, which can increase power reception for a given resonator size or footprint. The resonators 111 preferably have a large conductor thickness and a low dielectric loss tangent. Each resonator 111 preferably outputs power through a tap (e.g., conductive pin or via) at or near a current anti-node and/or through a coupled circuit. The resonators 111 can include resonant loops (e.g., as shown in FIG. 2), cross-resonators (e.g., as shown in FIG. 3B), split-ring resonators (e.g., as shown in FIG. 3C), electro-inductive-capacitive resonators (e.g., as shown in FIGS. 4A-4D), other physically small resonators (e.g., small relative to their resonance wavelength), and/or any other suitable resonators. However, the resonators can be otherwise configured.

The antenna 110 can optionally include multiple arrays (and/or other resonator arrangements) arranged with different orientations, which can function to efficiently couple to radiation of different polarizations (e.g., orthogonal polarizations). In a first embodiment, the antenna no includes parallel resonator layers (e.g., parallel resonator arrays), each layer having a different in-plane resonator orientation (e.g., orthogonal orientations, oriented at oblique angles, etc.). In a second embodiment, the antenna no includes resonators on non-parallel planes (e.g., orthogonal planes, planes oriented at oblique angles, etc.). However, the antenna no can additionally or alternatively include any other suitable resonators 111 and/or other antenna elements, and can have any other suitable arrangement. The antenna no can be a metamaterial or have any other suitable configuration.

The antennas of the transmitter (e.g., active antennas, passive antennas, etc.) and/or receiver can optionally include one or more supergaining antennas, supergaining arrays, arrays of supergaining antennas, and/or any other suitable structures capable or and/or configured to exhibit supergaining behavior. Supergaining structures can exhibit very high gain relative to their physical size. For example, such structures can exhibit an electrical area $A_e$, defined as $A_e = G\lambda^2/4\pi$, wherein $\lambda$ is the radiation wavelength and G is the antenna gain at that wavelength, much greater that their physical area A (e.g., footprint). In a first example, in which the antenna(s) define a sub-wavelength structure (e.g., define a length scale less than the radiation wavelength), the structures can exhibit an aperture efficiency, defined as $A_e/A$, of 2-100 (e.g., 6.5-10, 10-15, 15-22, 22-35, less than 6.5, greater than 25, etc.) and a quality factor of 100-5,000,000 (e.g., 500-5000, 5000-50,000, 50,000-750,000, less than 500, greater than 750,000, etc.). In a second example, in which the antenna(s) define a super-wavelength structure (e.g., define a length scale greater than the radiation wavelength), the structures can exhibit an aperture efficiency of 1-10 (e.g., 1.5-1.6, 1.6-1.7, 1.7-1.8, 1.8-1.9, 1.9-2, 2-2.15, less than 1.5, greater than 2.15, etc.) and a quality factor of 10-5,000,000 (e.g., 50-500, 500-5000, 5000-50,000, 50,000-750,000, less than 500, greater than 750,000, etc.). However, the structures can additionally or alternatively define any other suitable aperture efficiencies and/or quality factors.

In a first variation, such structures can include one or more resonators defining geometries that include sub-wavelength features (e.g., features defining characteristic dimensions smaller than the wavelengths of radiation that the resonator is configured to resonate with efficiently), such as cross-resonators (e.g., as shown in FIG. 3B), split-ring resonators (e.g., as shown in FIG. 3C), and/or electro-inductive-capacitive resonators (e.g., as shown in FIGS. 4A-4D). In a second variation, such structures can include a discretized aperture (e.g., array of metamaterial unit cells, such as cross-resonators, split-ring resonators, and/or electro-inductive-capacitive resonators; example shown in FIG. 3A), wherein the discrete elements of the aperture are controlled (e.g., independently, separately, etc.), such as to approximate a continuous distribution across the aperture. In a third variation, such structures can include an array of classical antenna elements (e.g., patch antennas, dipole antennas, etc.) arranged to enable and/or enhance supergaining behavior (e.g., as described in M. T. Ivrlač and J. A. Nossek, "High-efficiency super-gain antenna arrays," 2010 *International ITG Workshop on Smart Antennas (WSA)*, Bremen, 2010, pp. 369-374, which is hereby incorporated in its entirety by this reference).

3.2 Dynamic Impedance Match.

The dynamic impedance match 120 preferably functions to efficiently couple the antenna 110 to the downstream elements of the system (e.g., to the RF-DC converter 130). The dynamic impedance match 120 can include an input 121, a tuning network 122, a power measurement module 123, a control network 124, an output 125, and/or any other suitable elements (e.g., as shown in FIGURES SA-5B and/or 9A-9D).

The input 121 (e.g., RF power input) preferably functions to receive RF power from a power source (e.g., the antenna 110) that can exhibit arbitrary and/or changing output impedance and/or power magnitude. The input 121 can be electrically coupled to (e.g., electrically connected to, resonantly coupled to, configured to be driven by, etc.) the antenna 110 and/or other power source. For example, the input 121 can be connected to the antenna 110 by a coaxial cable. However, the input can be otherwise coupled to the antenna.

Figure 5A:
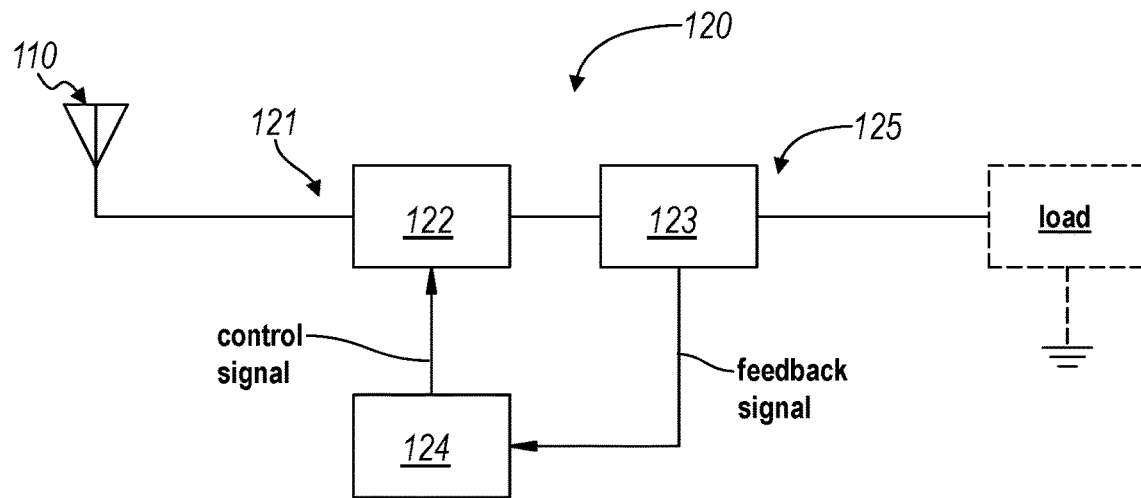
FIGS. 5A-5B are schematic representations of an embodiment and a specific example, respectively, of the dynamic impedance match.
Figure 5B:
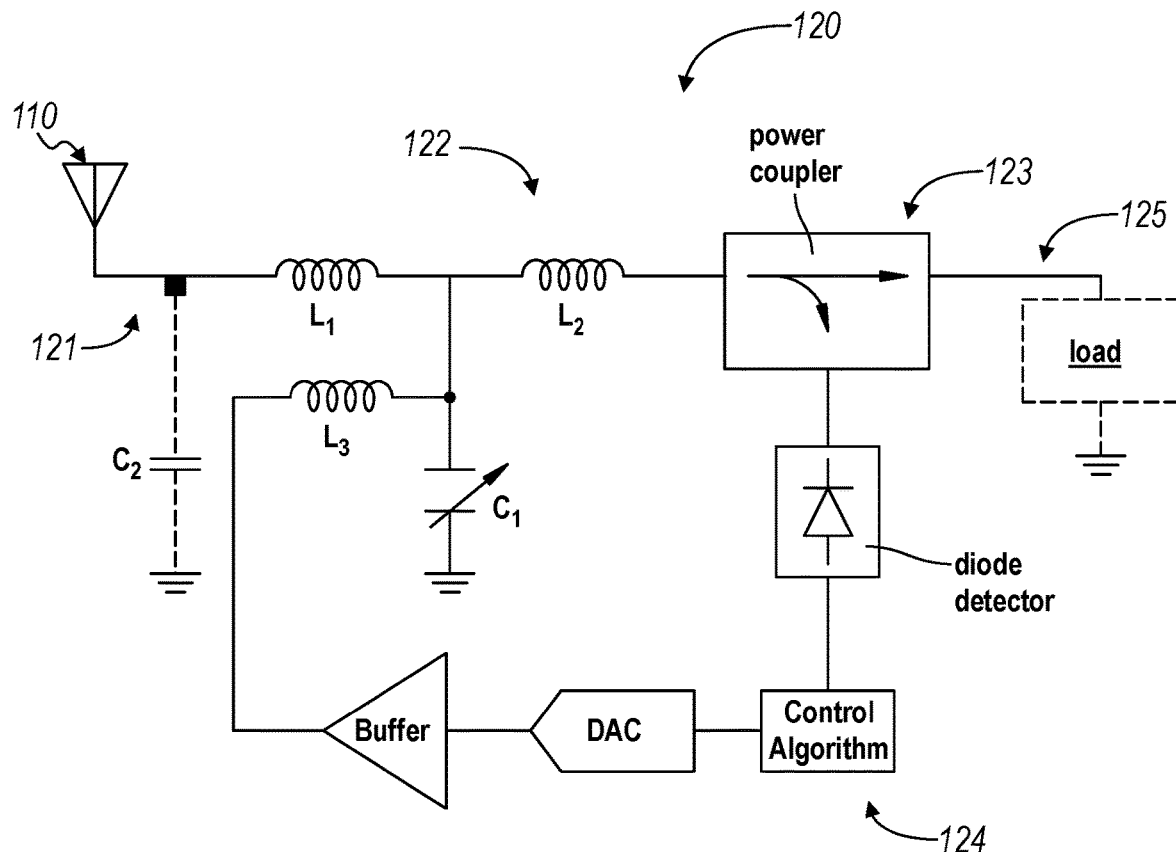
Figure 9A:
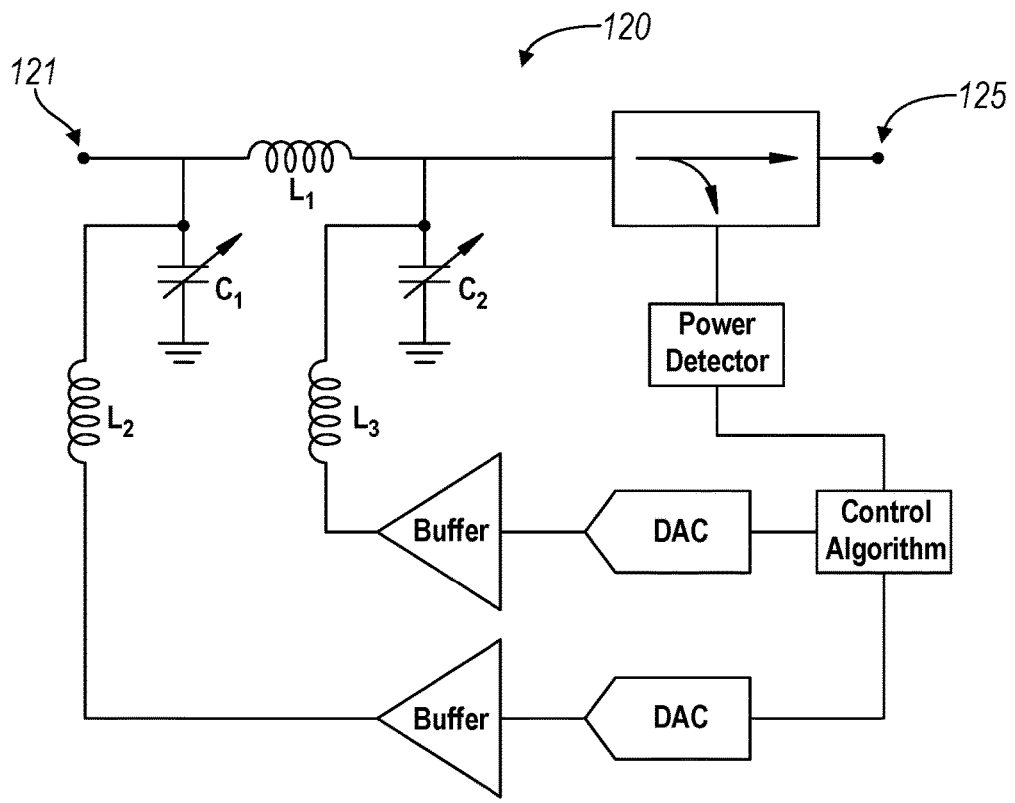
FIGS. 9A-9D are schematic representations of various specific examples of the dynamic impedance match.
Figure 9B:
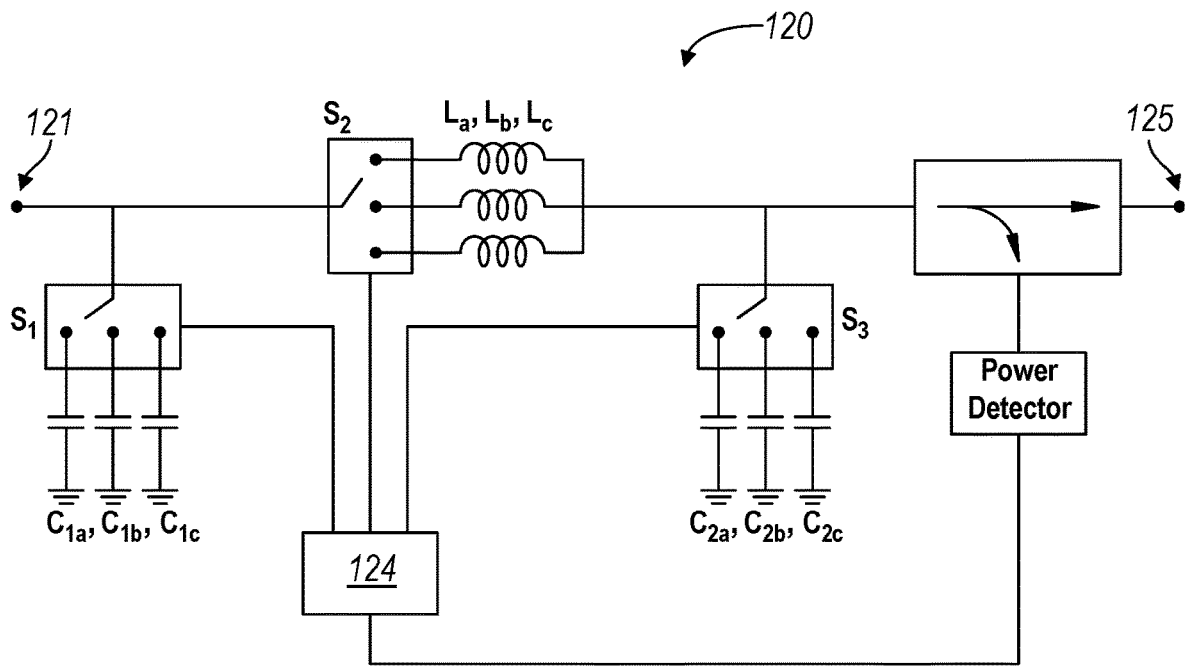
Figure 9C:
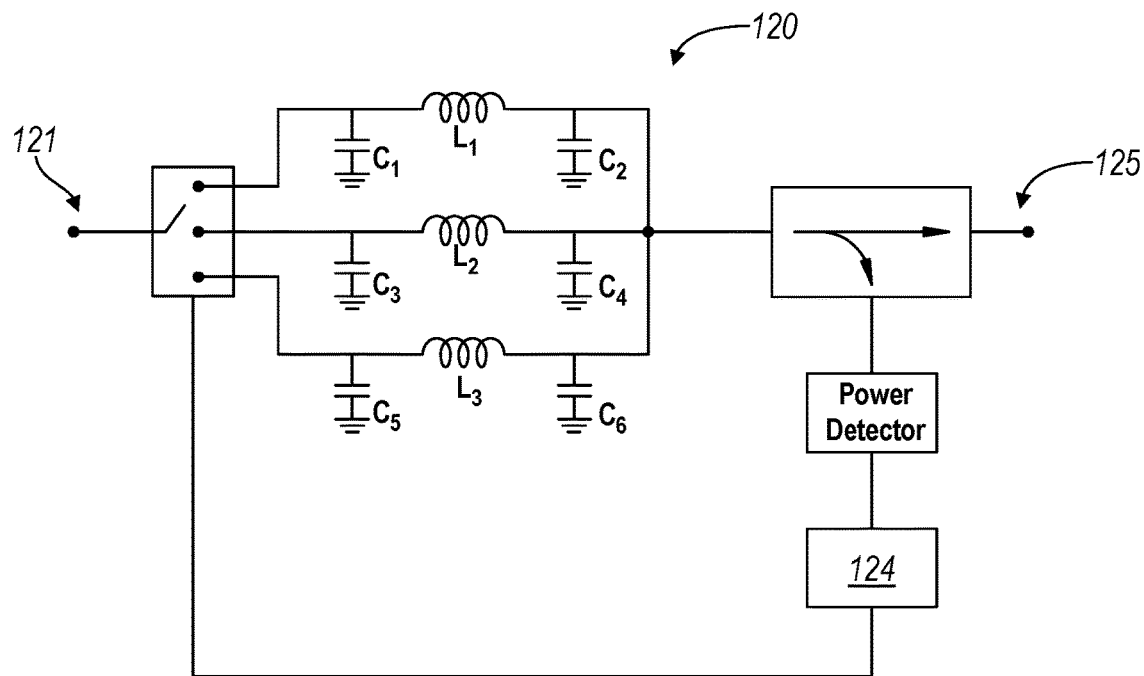
Figure 9D:
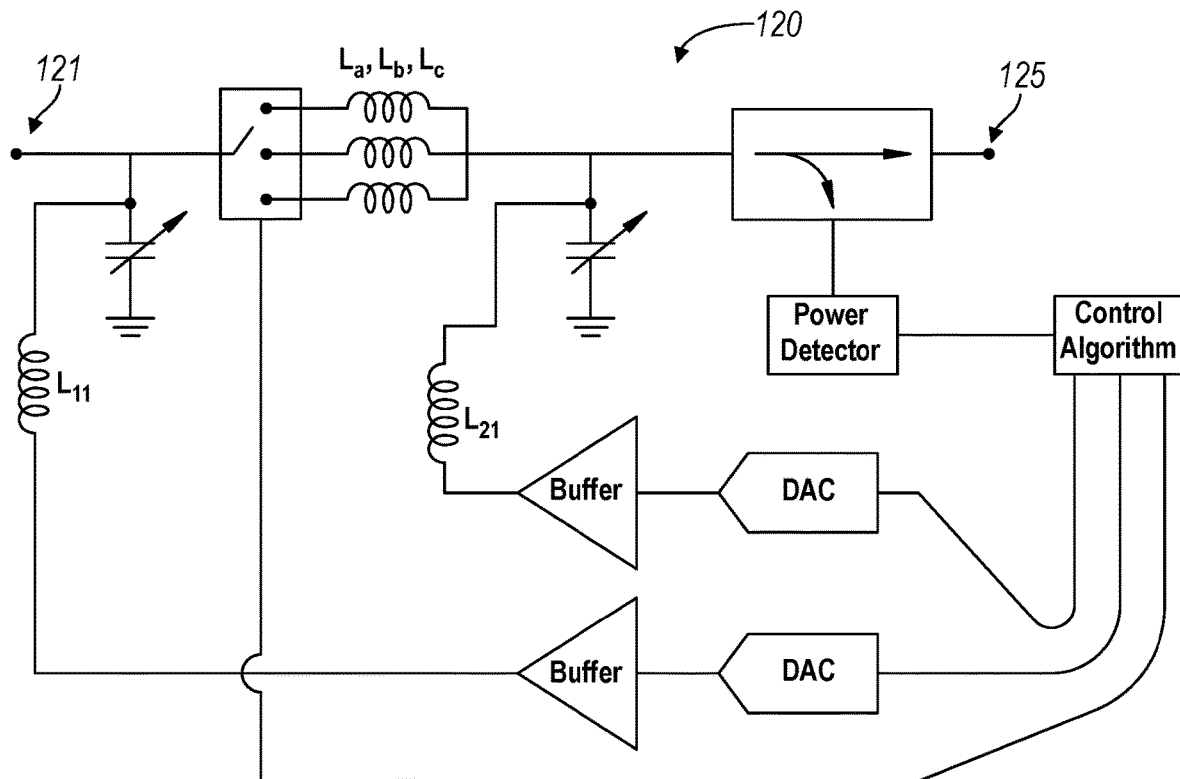

The tuning network 122 (e.g., impedance tuning network) preferably functions to tune the input impedance of the dynamic impedance match (e.g., the impedance experienced at the input 121 by the antenna 110). For example, the tuning network 122 can include a circuit including one or more inductors and capacitors. In one example, the tuning network 122 includes one or more variable electrical components (e.g., variable capacitor), preferably wherein the control network 124 is operable to alter the electrical properties of the variable component(s) (e.g., as shown in FIGS. 5B, 9A, and/or 9D). The tuning network 122 can additionally or alternatively include one or more switch banks (e.g., as shown in FIGS. 9B-9D), preferably controlled by the control network 124, operable to connect and disconnect certain matching components (e.g., fixed electrical components; variable components, such as described above; etc.) and/or matching networks (e.g., differently-tuned T-match, pi-match, and/or L-match networks). For example, there could be a series of capacitors (e.g., 1 pF, 2 pF, 3 pF, etc.) and/or inductors attached to a switch bank. The tuning network 122 is preferably a low-pass network (e.g., wherein the one or more inductors are connected between the input 121 and the power measurement module 123, and/or the one or more capacitors are connected between the inductors and ground), but can additionally or alternatively include a high-pass network (e.g., wherein the one or more capacitors are connected between the input 121 and the power measurement module 123, and/or the one or more inductors are connected between the capacitors and ground) and/or any other suitable network. The tuning network 122 can include one or more T-match, pi-match, and/or L-match networks (e.g., circuits), and can additionally or alternatively include any other suitable reconfigurable impedance matching network(s). The tuning network 122 can be electrically coupled (preferably electrically connected) to the input 121.

The power measurement module 123 (e.g., power measurement network) preferably functions to measure the RF power coupled into the dynamic impedance match 120 (e.g., through the tuning network 122). The power measurement module 123 preferably includes a power measurement module input, a power output (e.g., the output 125, a power output electrically coupled to the output 125, etc.), and a signal output. For example, the power measurement module 123 can include a power coupler and an RF power detector (e.g., RSSI detector). The power coupler preferably includes an input port (e.g., the power measurement module input), transmitted port (e.g., the power output), and coupled port, and optionally includes an isolated port and/or any other suitable ports. The power coupler preferably transmits most power from the tuning network 122 (e.g., received at the power coupler input port) to the transmitted port, and couples a small portion of the power (e.g., via the coupled port) into an RF power detector (e.g., RSSI detector), which preferably outputs a power measurement signal. The power coupler can have a coupling factor (e.g., defined as $10 \log(P_{coupled}/P_{in})$, wherein $P_{in}$ is the input power at the input port and $P_{coupled}$ is the output power at the coupled port) of negative 3, 6, 10, 20, 30, 3-6, 6-10, 10-20, or 20-30 dB, and/or any other suitable coupling factor. The power coupler can include a transmission line coupler (e.g., coupled transmission lines, branch-line coupler, Lange coupler, T-junction power divider, Wilkinson power divider, hybrid ring coupler, etc.), a waveguide coupler (e.g., waveguide branch-line coupler, Bethe-hole coupler, Riblet short-slot coupler, Schwinger reversed-phase coupler, Moreno crossed-guide coupler, waveguide hybrid ring coupler, magic tee coupler, etc.), and/or any other suitable power coupler. The RF power detector can, for example, include (e.g., be) a diode detector that outputs a rectified signal to the control network 124 (e.g., at the signal output).

The control network 124 preferably functions to dynamically control the tuning network 122 (e.g., to optimize power coupling into the dynamic impedance match 120). The control network 124 preferably implements a control algorithm. The control algorithm preferably includes an optimization algorithm (e.g., single variable optimization such as a line search, multivariable optimization algorithm, etc.), but can additionally or alternatively include any other suitable algorithms. For example, the control algorithm can include a power optimization algorithm (e.g., maximum power point tracking algorithm), such as one typically used for photovoltaic devices (e.g., line search algorithm, perturb-and-observe algorithm, etc.). The control network 124 can optionally include one or more compensators. In one variation, the control network 124 includes: an analog-to-digital converter that converts the rectified signal from the diode detector into a digital signal, an optimization circuit that implements the control algorithm based on the digital signal, a digital-to-analog converter that converts the output of the optimization circuit to an analog signal, and a buffer amplifier that outputs the analog signal to the tuning network 122, preferably via an inductive element (e.g., control network inductor) that electrically couples (e.g., connects) the buffer amplifier to the tuning network, but additionally or alternatively via any other suitable element(s) in any suitable arrangement.

The inductance (e.g., control inductance) of the control network inductor is preferably substantially greater than the inductance of one or more inductive elements of the tuning network (e.g., tuning network inductances, such as inductances of inductors of a T-match, pi-match, or L-match network), and/or the impedance of the control network inductor is preferably substantially greater than the impedance (e.g., at the incoming wave frequency) of the controlled element (e.g., control network, element of the control network such as one or more inductors and/or capacitors, etc.). For example, the impedance of the control network inductor (and/or the control inductance) can be greater than the impedance of the controlled element by more than a threshold amount (e.g., threshold factor, such as 1.1, 1.25, 1.5, 2, 5, 10, 20, 50, 100, 200, 500, 1000, 2000, 5000, 10,000, 100,000, 1,000,000, 1-2, 2-5, 5-10, 10-20, 20-50, 50-100, 100-200, 200-500, 500-1000, 1000-2000, 2000-5000, 5000-10,000, 10,000-100,000, or 100,000-1,000,000 times greater, etc.; threshold absolute inductance, such as greater by more than 1, 2, 5, 10, 20, 50, 100, 200, 500, 1000,1-2, 2-5,5-10, 10-20, 20-50, 50-100, 100-200, 200-500, or 500-1000 pH, nH, pH, mH, or H, etc.). The control inductance is preferably large enough such that its impedance at the incoming wave frequency is substantially large enough to not significantly affect the impedance of the controlled element. In a specific example, the impedance of the control network inductor is at least 10 times greater than the impedance of the controlled element. However, the control inductance and/or impedance can additionally or alternatively be equal (or substantially equal, such as within 0.1%, 1%, 2%, 5%, 10%, or 25%) to one or more of the tuning network inductances and/or impedances, substantially less than one or more of the tuning network inductances and/or impedances (e.g., by more than the threshold amount), and/or have any other suitable value.

In one example (e.g., as shown in FIG. 5B), the tuning network includes one or more inductors (e.g., inductors L1 and/or L2) and/or capacitors (e.g., capacitors C1 and/or C2). In this example, one or more of the inductors preferably electrically couples (e.g., connects) the antenna to the power measurement network and the power output, and/or one or more of the capacitors preferably electrically couples (e.g., connects) one or more of the inductors (and/or any other suitable elements, such as the antenna, power measurement network, etc.) to ground. Such as shown in FIG. 5B, the tuning network can define a T-match network (e.g., wherein an optional capacitor C2, which may be connected near the input 121, such as at a point between the antenna 110 and the inductor L1, is absent), a pi-match network (e.g., wherein the second inductance of inductor L2 is substantially zero, such as zero, negligible, and/or much less than the first inductance of inductor L1), an L-match network (e.g., wherein the optional capacitor C2 is absent and either the first or second inductance is substantially zero), and/or any other suitable tuning network. In this example, the control network inductor L3, which electrically couples the control network (e.g., buffer amplifier) to the tuning network, is preferably electrically coupled (e.g., connected) to the tuning network between at least one of the tuning network inductors and at least one of the tuning network capacitors.

However, the control network 124 can additionally or alternatively include any other suitable elements in any other suitable arrangement, and the dynamic impedance match 120 can additionally or alternatively include any other suitable electrical couplings and/or connections.

3.3 RF-DC Converter.

Figure 6A:
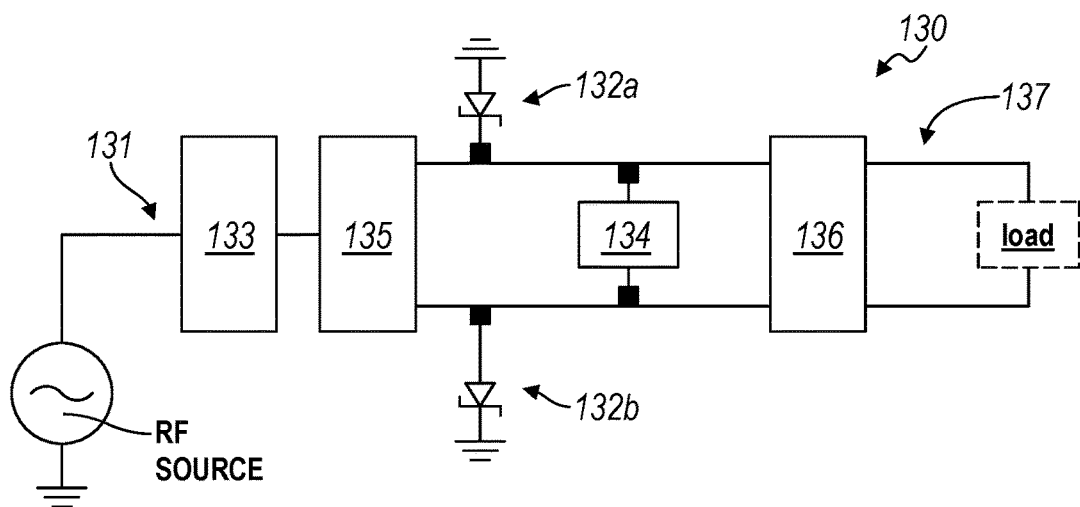
FIGS. 6A-6B are schematic representations of an embodiment and a specific example, respectively, of the RF-DC converter.
Figure 6B:
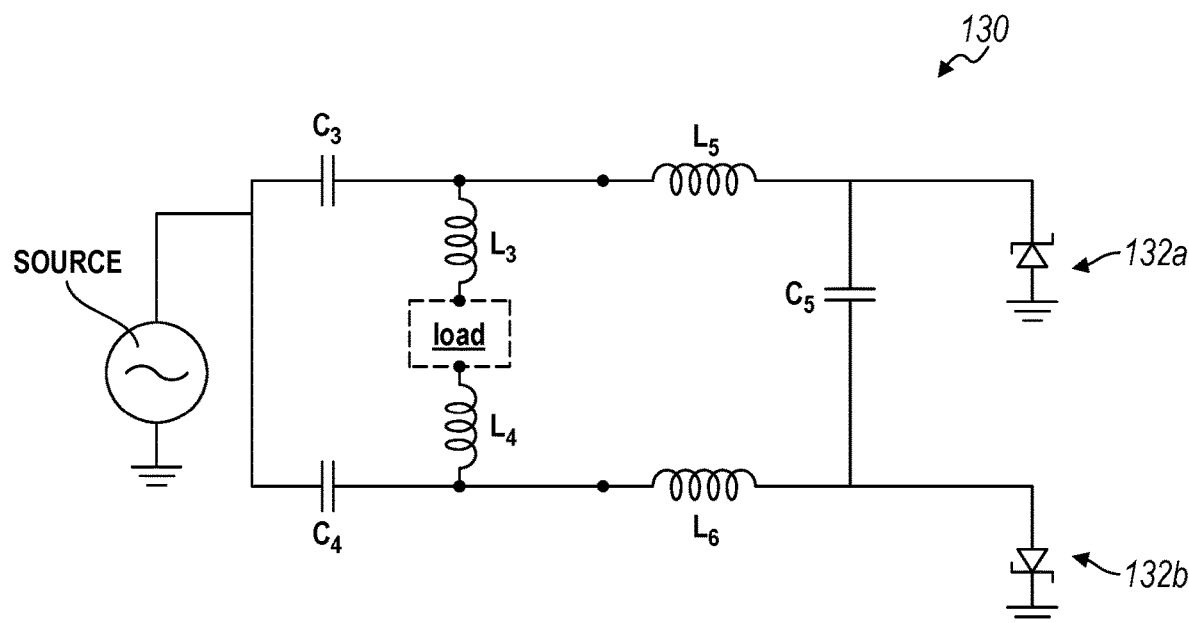

The RF-DC converter 130 preferably functions to efficiently convert RF input power to DC output power. The RF-DC converter 130 (e.g., rectifier) preferably includes a class-F rectifier, but can additionally or alternatively include any other suitable rectifiers. The RF-DC converter 130 can include an input 131, diodes 132, DC blocking filters (e.g., series DC blocking filter 133, shunt DC blocking filter 134, etc.), low pass filters 135, DC pass filters 136, outputs 137, and/or any other suitable elements (e.g., as shown in FIGS. 6A-6B).

The input 131 (e.g., rectifier input) preferably functions to receive RF power. The input 131 can be electrically coupled to the antenna 110, preferably via the dynamic impedance match 120. For example, the input 131 can be electrically connected to the output 125 of the dynamic impedance match (e.g., by a waveguide, such as a coaxial cable, microstrip, etc.).

The diodes 132 preferably function to provide passive waveshaping (e.g., of the input RF power). The diodes 132 can (individually and/or cooperatively) generate common-mode and/or differential-mode RF signals (e.g., harmonics of the input RF power signal). The diodes 132 preferably define an antisymmetric diode pair (e.g., two diodes 132*a* and 132*b* with opposing orientations, one between each transmission line and ground). The antisymmetric diode pair preferably generates odd harmonics in the common-mode signal and even harmonics in the differential mode signal (e.g., such that the common-mode signal approximates a square wave). The diodes 132 can be Zener diodes, Schottky diodes, and/or any other suitable diodes or other rectifying components (e.g., transistors, thyristors, any other suitable non-linear circuit elements and/or devices, etc.).

The RF-DC converter 130 can include series DC blocking filters 133 (e.g., capacitors C3 and/or C4), shunt DC blocking filters 134 (e.g., capacitor C5), and/or any other suitable filters. The shunt DC blocking filter 134 preferably functions to short the differential-mode RF signal (e.g., containing substantially only even harmonics of the input RF power signal). The DC blocking filters preferably include one or more capacitors, and can additionally or alternatively include any other suitable components.

The low pass filter 135 preferably functions as a harmonic terminator. The low pass filter 135 preferably does not significantly attenuate the fundamental RF signal (the input RF power signal), and preferably strongly reflects harmonics (e.g., harmonics generated by and/or reflected off of the diodes 132 and sent back towards the input 131) of the fundamental (e.g., presents matched or near-matched impedance to the fundamental and high impedance to the harmonics). The low pass filter 135 preferably provides a high impedance to these harmonics that are traveling from the diodes 132 towards the input 131, and the impedance presented to the harmonics traveling from the diodes 132 towards the filter 135 may be substantially different than or similar to (e.g., substantially equal to) the impedance that would be presented to the harmonics if they were travelling from the input 131 toward the filter 135. The low pass filter 135 preferably includes one or more inductors (e.g., inductors L5 and/or L6), and can additionally or alternatively include any other suitable components. Although described herein as a low pass filter, the low pass filter 135 can additionally or alternatively include one or more band pass filters and/or any other suitable filters.

The DC pass filter 136 preferably functions to restrict the fundamental RF signal (e.g., while transmitting the DC power generated by the RF-DC converter 130). The DC pass filter 136 preferably includes one or more inductors (e.g., inductors L3 and/or L4) and/or capacitors, and can additionally or alternatively include any other suitable components. The DC pass filter 136 can be electrically coupled (e.g., directly electrically connected) to the output 137 (e.g., rectifier output), which preferably functions to output the DC power.

3.4 DC Impedance Converter.

Figure 7A:
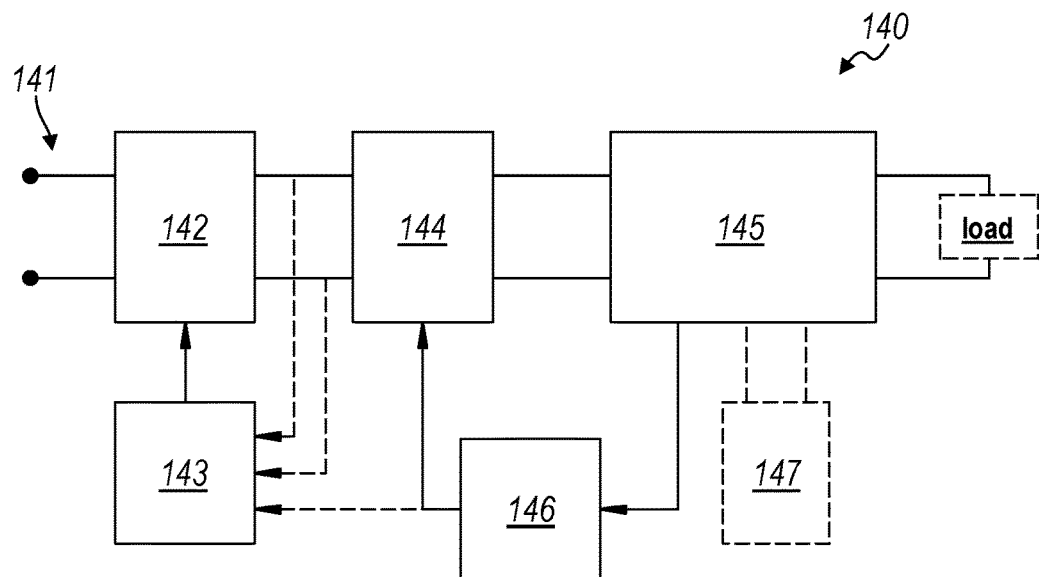
FIGS. 7A-7B are schematic representations of an embodiment and a specific example, respectively, of the DC impedance converter.
Figure 7B:
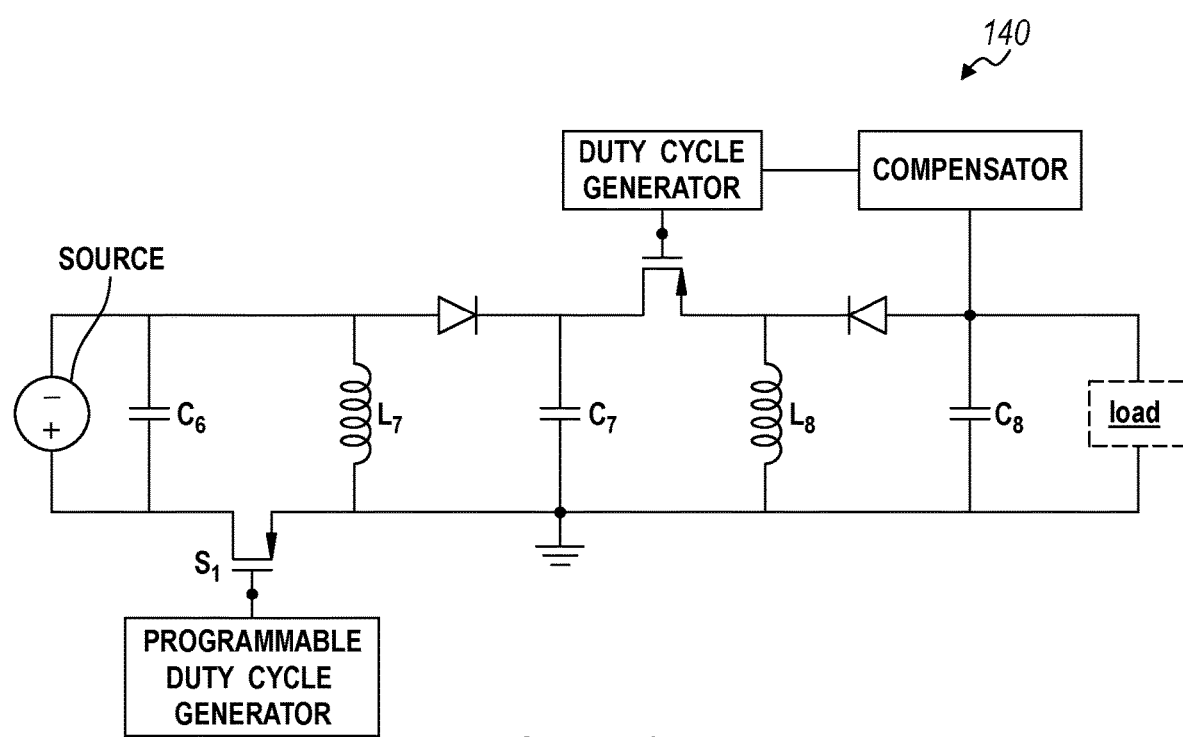

The DC impedance converter 140 preferably functions to present a substantially optimal load to the RF-DC converter output 137 (e.g., regardless of an arbitrary and/or changing load at the DC power output 150), such as by operating in a discontinuous conduction mode (e.g., feedforward discontinuous conduction mode), and/or to present a substantially consistent output to the load (e.g., standard output voltage, such as 3.3, 3.6, 4.5, 5, 6, 9, 12, 20, 24, 28, 36, 48, or 72 V). The load can be a user device (e.g., smartphone, smartwatch, etc.), or be any other suitable powered system. The DC impedance converter 140 can include an input 141, DC-DC converters (e.g., a first 142 and/or second switching DC-DC converter 144), DCM maintenance control 143, parameter measurement module 145, and feedback control 146 (e.g., as shown in FIGS. 7A-7B). The DC impedance converter 140 can additionally or alternatively include an electrical energy store 147 and/or any other suitable elements.

The input 141 preferably functions to receive DC power. The input 141 can be electrically coupled (preferably electrically connected) to the RF-DC converter output 137. The input 141 preferably presents an input impedance substantially equal to the optimal load for the RF-DC converter 130, but can additionally or alternatively present any other suitable input impedance.

The DC-DC converters are preferably buck-boost converters, but can additionally or alternatively include single-ended primary-inductor converters (SEPIC), and/or any other suitable DC-DC converter (e.g., buck, boost, Ćuk, etc.). The DC-DC converters can include inductors (e.g., inductor L7 and/or L8), capacitors (e.g., capacitor C6 and/or C7), and/or any other suitable elements. The first switching DC-DC converter 142 preferably operates in a discontinuous conduction mode (DCM) and/or is preferably designed to enable operation in the DCM (e.g., includes a low-value inductor, such as inductor L7), but can additionally or alternatively operate in a continuous conduction mode (e.g., to achieve an input impedance outside a range of input impedances achievable under DCM conditions, such as based on a feedforward and/or feedback control). The first switching DC-DC converter 142 can be electrically coupled (preferably electrically connected) to the input 141.

The DC impedance converter 140 can optionally include a second switching DC-DC converter 144, which preferably operates in a continuous conduction mode. The second converter 144 is preferably arranged downstream of the first converter 142 (e.g., wherein the first converter 142 is between the input 141 and the second converter 144). However, the second switching DC-DC converter 144 could be omitted entirely and/or replaced with a different subsystem that is not necessarily a DC-DC converter. In a first variation, in which a battery is placed at the output of the first switching DC-DC converter 142 (e.g., instead of the second switching DC-DC converter 144), the output voltage of 142 is substantially fixed to be the battery voltage. In this variation, 142 would serve as a constant voltage current source that dumps charge into the battery. In a specific example, in which the first switching DC-DC converter 142 exhibits a converter efficiency $\eta$, if a battery with voltage $V_{out}$ is placed at the output of the first switching DC-DC converter 142, and an input impedance of $Z_{in}$ is specified to be the input impedance of the first switching DC-DC converter 142, then the current flowing into the battery is approximately equal to $(\eta*V_{in}^2)/(V_{out}*Z_{in})$. The output voltage will be regulated by the battery and only the current flowing into the battery will be altered to preserve the necessary converter input impedance. In a second variation, the voltage is fixed in some manner other than by a battery, such as using a zener diode and/or a charged capacitor (e.g., an energy storage element that can accept trickle charging). In alternative variations, a linear regulator could be used; fixing a storage element directly to the output of the first switching DC-DC converter 142 could be used; a standard charge controller could be used; more advanced control such as an additional DC-DC converter (e.g., converter such as described above); and/or any other suitable system (e.g., system in which strong load regulation is not needed) could be used. The second switching DC-DC converter 144 could additionally or alternatively function as a power routing network (e.g., a switch to pass power from the first switching DC-DC converter 142 to a battery and/or some other load, etc.). However, the DC impedance converter 140 can additionally or alternatively include any other suitable DC-DC converters in any suitable arrangement.

The DCM maintenance control 143 preferably functions to maintain the first switching DC-DC converter 142 in the discontinuous conduction mode. However, the DCM maintenance control 143 can additionally or alternatively function to maintain the first switching DC-DC converter 142 in a continuous conduction mode (CCM), such as to achieve an input impedance outside a range of input impedances achievable under DCM conditions. The DCM maintenance control 143 can be electrically coupled (preferably electrically connected) to the first switching DC-DC converter 142. In one example, the DCM maintenance control 143 includes a programmable duty cycle generator electrically connected to a control element (e.g., MOSFET gate) of the first switching DC-DC converter (e.g., to maintain it in a discontinuous conduction mode). The DCM maintenance control 143 can include a feedforward control (e.g., statically operating the duty cycle generator) and/or a feedback control (e.g., dynamically adjusting duty cycle generator operation based on DC impedance converter operation measurements, such as based on the output of the first switching DC-DC converter 142 and/or based on operation of the second switching DC-DC converter 144 and/or the associated feedback control 146). The DC impedance converter operation measurements can include: inductor current and/or capacitor voltage (e.g., for the inductors and/or capacitors of the first switching DC-DC converter 142, such as inductor L7 and/or capacitor C6); voltage, current, and/or power output from the DC impedance converter 140 and/or the first switching DC-DC converter 142 (e.g., wherein the control 143 is configured to optimize for the maximum power output from the converter); and/or any other suitable parameter measurements.

The parameter measurement module 145 preferably functions to measure one or more parameters (e.g., voltage, current, etc.) to be regulated at the DC power output 150. The parameter measurement module 145 can be electrically coupled (preferably electrically connected) to the second switching DC-DC converter 144 (e.g., at the parameter measurement module input) and/or to the DC power output 150 (e.g., at the parameter measurement module output).

The feedback control 146 preferably functions to maintain the second switching DC-DC converter 144 in a continuous conduction mode and/or to regulate one or more output parameters (e.g., the parameters measured by the parameter measurement module 145). The feedback control 146 can be electrically coupled (preferably electrically connected) to the second switching DC-DC converter 144 (e.g., at the feedback control output) and/or to the DC power output 150 (e.g., at the parameter feedback control input).

In one example, the feedback control 146 includes a compensator and a duty cycle generator. In this example, the compensator input is electrically connected to the DC power output 150, and the compensator output controls the duty cycle generator. Further, in this example, the duty cycle generator output is electrically connected to a control element (e.g., MOSFET gate) of the second switching DC-DC converter (e.g., to maintain it in a continuous conduction mode).

The DC impedance converter 140 can optionally include one or more electrical energy stores 147. The electrical energy store 147 can function to buffer DC power delivery to the load and/or to power operation of the DC impedance converter 140 (and/or any other suitable elements of the system, such as the control network 124), such as during system startup (e.g., before wirelessly-received power is available to power the active elements of the system) and/or throughout system operation. In one variation, the DC impedance converter 140 can control DC power routing between the input 141, electrical energy store 147, and DC power output 150. For example, when excess power (e.g., exceeding the load's requirements) is available, it can be routed to the electrical energy store 147, and when the load's power demands exceed the power from the input 141, the deficit can be provided from the electrical energy store 147. The electrical energy store 147 can include one or more batteries, capacitors (e.g., supercapacitors, capacitor C8, etc.), and/or any other suitable electrical energy storage components. In one example, DC power routing for the DC impedance converter is achieved through a load switch that is controlled by an onboard logic unit that responds to one or more measurements, such as battery level and/or power, voltage, and/or current output to the energy storage element and/or load.

The DC impedance converter 140 (and/or any other suitable elements of the system) can additionally or alternatively include one or more bootstrapping networks. The bootstrapping network preferably functions to power operation of the DC impedance converter 140 (and/or any other suitable elements of the system, such as the control network 124), such as during system startup (e.g., before active elements of the system have started up and/or converged on acceptable configurations for efficient wireless power reception and/or delivery) and/or throughout system operation. The bootstrapping network preferably receives (and distributes) power from the DC impedance converter output (e.g., analogous to an additional load), which can be beneficial as the bootstrapping network will not substantially alter the input impedance (e.g., by a possibly arbitrary and/or variable amount) at the RF-DC converter output 137. However, the bootstrapping network can additionally or alternatively receive (and distribute) power from the RF-DC converter output 137 and/or from any other suitable location. In one example, during receiver startup (e.g., before the DC impedance converter is powered, immediately following initial reception of substantial wireless power, etc.), the DC impedance converter allows power flow from the RF-DC converter output 137 to the bootstrapping network (e.g., to the electrical energy store 147, such as an output capacitor of the DC impedance converter), and the bootstrapping network regulates (e.g., loosely regulates) delivery of this power to the active elements of the DC impedance converter (e.g., DCM maintenance control 143, parameter measurement module 145, and/or feedback control 146, etc.) and/or any other suitable elements of the system. Once powered by the bootstrapping network, the active elements can achieve normal operation of the DC impedance converter, regulating power flow from the RF-DC converter output 137 to the load and to continue powering the active elements. However, the DC impedance converter 140 can additionally or alternatively include any other suitable elements in any suitable arrangement, with any other suitable electrical couplings and/or connections.

3.5 Electrical Array.

Figure 1B:
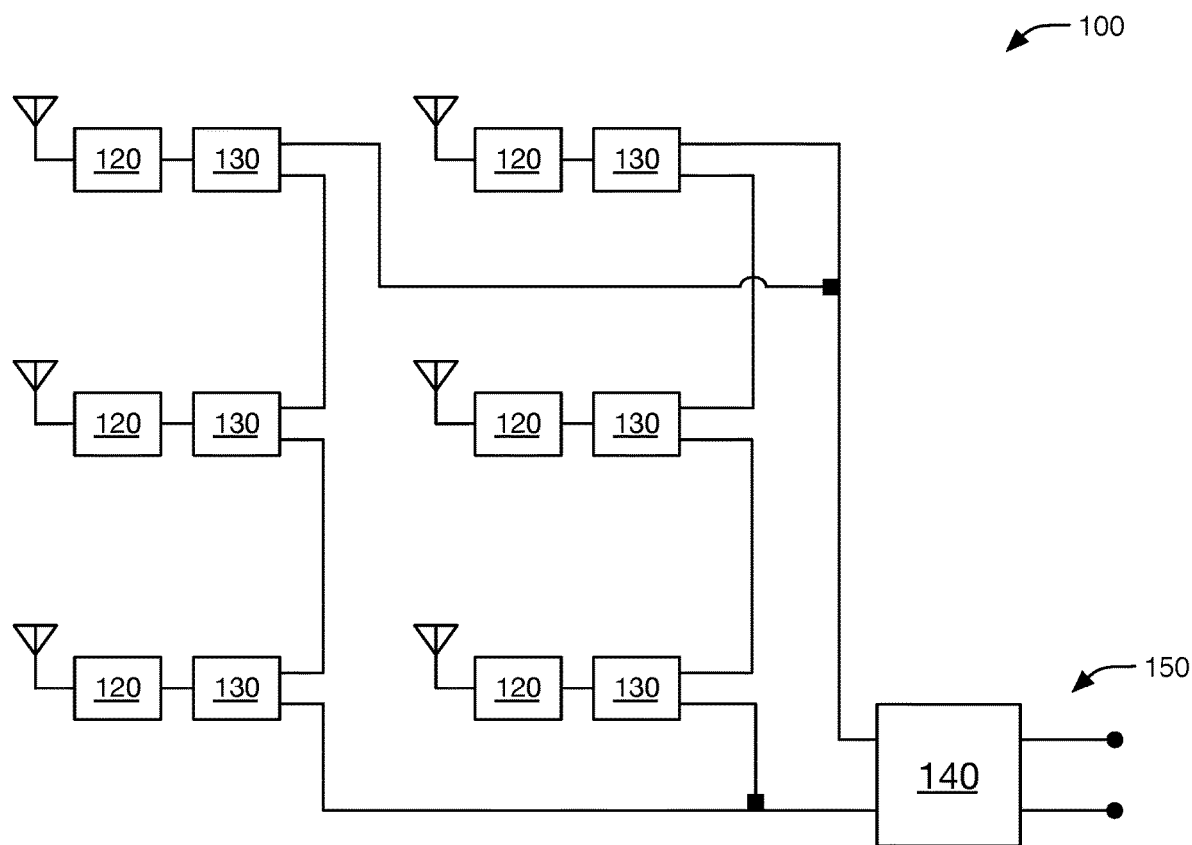

The system 100 can optionally include a plurality of some or all of the system elements. Including duplicate elements can enable reception of greater amounts of RF power (e.g., due to favorable arrangements of multiple antennas 110). The duplicate elements are preferably electrically connected in a parallel-series array (e.g., as shown in FIG. 1B), which can reduce the variance in current and/or voltage produced by the array (e.g., compared with the variance of an element of the array, variance between the elements, etc.). In one embodiment, the system 100 includes an array of input subsystems that all feed into a single output subsystem. In this embodiment, the input subsystems each include an antenna 110, dynamic impedance match 120, and RF-DC converter 130, and the output subsystem includes a single DC impedance converter 140 and DC power output 150. The system 100 preferably includes only a small number (e.g., one) of DC impedance converters 140, which can typically be large and/or expensive. However, the system 100 can include any suitable number of elements in any suitable arrangement.

4. Method.

Figure 8:
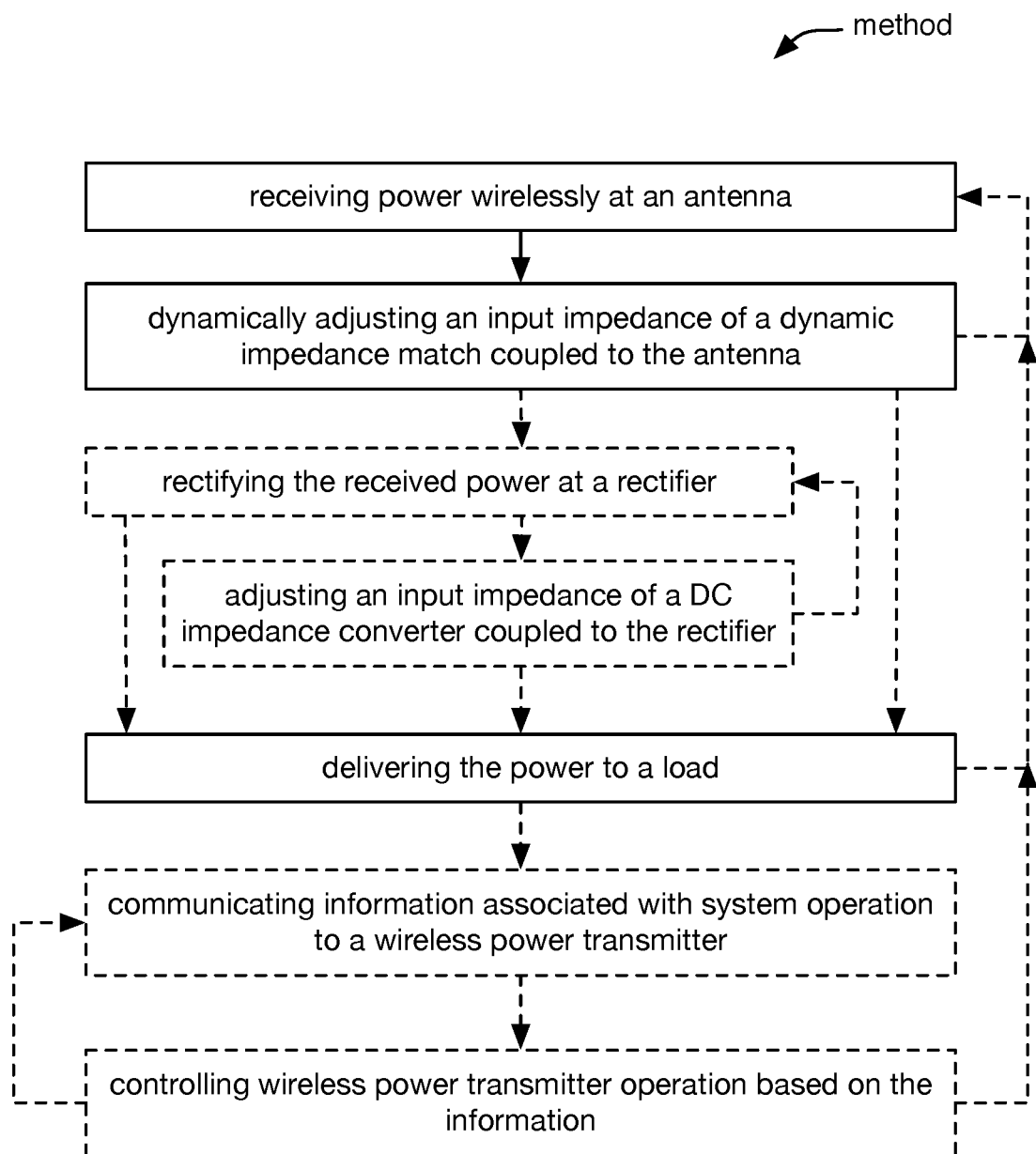
FIG. 8 is a flowchart representation of an embodiment of the method.

A method for wireless power reception preferably includes (e.g., as shown in FIG. 8): receiving power (e.g., RF radiation, such as microwave radiation) wirelessly at an antenna, dynamically adjusting an input impedance of a dynamic impedance match coupled to the antenna, and/or delivering the power to a load. The method can additionally or alternatively include rectifying the received power at a rectifier, adjusting an input impedance of a DC impedance converter coupled to the rectifier, communicating information associated with system operation to a wireless power transmitter, and/or controlling wireless power transmitter operation based on the information. However, the method can additionally or alternatively include any other suitable elements performed in any suitable manner.

The method is preferably performed using (e.g., by) the system 100 (e.g., as described above, such as regarding functionality, behavior, and/or use of the system elements), optionally in coordination with one or more wireless power transmitters, but can additionally or alternatively be performed using any other wireless power receivers and/or other suitable systems. The method is preferably performed in response to receiving wireless power at the receiver and/or receiving a request to receive wireless power, but can additionally or alternatively be performed at any other suitable time.

The power is preferably received wirelessly from propagating (e.g., "far-field") radiation, but can additionally or alternatively be received from evanescent (e.g., "near-field") radiation. The received radiation is preferably one or more pure-tone (or substantially pure-tone, such as defining a bandwidth less than a threshold bandwidth) signals (e.g., which can be beneficial in embodiments that employ one or more supergaining structures and/or other narrow bandwidth antennas), but can additionally or alternatively include any suitable signal types (e.g., in embodiments that employ wider-bandwidth antennas, in embodiments in which communication signals are transmitted along with the power, etc.). In a first specific example, the radiation has a GHz-scale frequency (e.g., 5-10 GHz, such as 5.8 GHz and/or greater than 5.8 GHz). In a second specific example, the radiation has a hundreds of MHz-scale frequency (e.g., 100-500 MHz, such as 433 MHz and/or less than 433 MHz). However, the power can additionally or alternatively be received in any other suitable form.

In one embodiment, the method includes (e.g., at the system 100, at one or more subsets of the system 100, at multiple systems 100, at another system, etc.): receiving power (e.g., RF power) wirelessly at an antenna; coupling all or some of the power to a power measurement network via an impedance tuning network; at the power measurement network, outputting a feedback signal (e.g., rectified electrical signal output by a diode of the power measurement network) to a control network (e.g., in response to coupling the power to the power measurement network), the feedback signal indicative of a power metric associated with the power (e.g., amount of power coupled to the power measurement network, such as the RSSI, etc.); determining a control signal (e.g., at the control network), such as based on the feedback signal and a power optimization algorithm (e.g., as described above, such as regarding the control network 124); outputting the control signal (e.g., at the control network) to the impedance tuning network (e.g., wherein the input impedance of the impedance tuning network is modified by the respective control signal); and/or delivering some or all of the power to an output via the impedance tuning network. In this embodiment, the antenna can be electrically coupled to (e.g., electrically connected to, resonantly coupled to, operable to drive, etc.) the impedance tuning network (e.g., via a lead, trace, wire, waveguide, resonant coupling, etc.), preferably to the input of the impedance tuning network, wherein RF input impedance (e.g., input impedance of the impedance tuning network, input impedance experienced by the antenna, etc.; impedance at an RF frequency, such as the frequency of RF power received by the antenna) is adjusted based on the control signal (e.g., adjusted directly by the control signal, such as by injection of a control signal current into the impedance tuning network and/or application of a control signal voltage to the impedance tuning network). Some or all of these method elements are preferably performed repeatedly (e.g., in an iterative loop; continuously, periodically, sporadically, in response to triggers, etc.).

Determining the control signal preferably includes implementing a power optimization algorithm (e.g., as described above, such as regarding the control network 124), such as implemented over a series of iterations of a portion of the method elements. For example, in an iteration of the power optimization algorithm, the current control signal can modify the input impedance of the impedance tuning network, thereby modifying the coupling of power to the antenna, power measurement network, and/or output; the power measurement network can output an updated feedback signal based on the modified power coupling; and the control network can determine (e.g., based on the algorithm) an updated control signal based on the current control signal, the associated updated feedback signal, and preferably one or more previous control signals and associated feedback signals. In this manner, the control network can determine a desired feedback signal (and optionally, an associated feedback signal and/or other metric associated with the feedback signal), preferably an optimal feedback signal (e.g., associated with the best feedback signal achieved, such as the feedback signal indicative of the greatest power coupling).

The method can optionally include communicating information associated with system operation to a wireless power transmitter and/or controlling wireless power transmitter operation based on the information. For example, the method can include cooperation between the system and one or more power transmitters and/or other power receivers (e.g., using a wireless communication module, such as a Wi-Fi, Bluetooth, or BLE radio) to optimize power transmission (e.g., to the system, to the set of all power receivers, etc.). For example, the system can transmit an indication of the received power (e.g., power at the antenna 110, power measurement module 123, DC impedance converter 140, DC power output 150, etc.). The system can transmit periodically, when requested, and/or with any other suitable timing. In one example, the system continuously optimizes the dynamic impedance match(es) 120 (e.g., as a fast optimization inner loop, such as described above regarding implementing the power optimization algorithm), and transmits data representing the optimized power magnitude (e.g., measured by the power measurement module(s) 123). In this example, the power transmitter can adjust power transmission parameters based on the data received from the system, preferably to optimize power transmission to the system (e.g., as a slower optimization outer loop). In a second example, all of the receiver parameters are initially set to predetermined values (e.g., pre-calculate to be a good baseline), such as by configuring the DC impedance converter duty cycle and/or the RF dynamic impedance match to predetermined values upon startup. Then, the transmitter optimization loop is performed (e.g., quickly, preferably as quickly as possible) to determine the transmission parameters, and then the receiver-side optimizations are performed (e.g., once, continuously, periodically, etc.) under fixed transmission parameters, which can reduce timing issues and/or complexity. However, the method can additionally or alternatively include any other suitable elements performed in any suitable manner.

Although omitted for conciseness, the preferred embodiments include every combination and permutation of the various system components and the various method processes. Furthermore, various processes of the preferred method can be embodied and/or implemented at least in part as a machine configured to receive a computer-readable medium storing computer-readable instructions. The instructions are preferably executed by computer-executable components preferably integrated with the system. The computer-readable medium can be stored on any suitable computer readable media such as RAMs, ROMs, flash memory, EEPROMs, optical devices (CD or DVD), hard drives, floppy drives, or any suitable device. The computer-executable component is preferably a general or application specific processing subsystem, but any suitable dedicated hardware device or hardware/firmware combination device can additionally or alternatively execute the instructions.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

I claim:

1. A radio frequency (RF) power receiver comprising:
   a plurality of receiver modules, each receiver module of the plurality comprising:
   an antenna;
   a power measurement network comprising:
      a power coupler comprising: an input port, a transmitted port, and a coupled port; and
      an RF power detector electrically coupled to the coupled port;
      an impedance tuning network electrically coupling the antenna to the input port, the impedance tuning network defining an RF input impedance presented to the antenna; and
      a control network configured to receive a signal from the RF power detector and modify the RF input impedance based on the signal;
   a DC impedance converter; and
   a set of rectifiers electrically coupling the plurality of receiver modules, at the respective transmitted port of each receiver module of the plurality, to the DC impedance converter.

2. The RF power receiver of claim 1, wherein, for each receiver module of the plurality:
   the impedance tuning network comprises a control input electrically coupled between the antenna and the input port; and
   the control network electrically couples to the control input, wherein the control network is configured to provide an electrical control signal to the impedance tuning network at the control input, thereby modifying the RF input impedance.

3. The RF power receiver of claim 2, wherein, for a first receiver module of the plurality:
   the impedance tuning network of the first receiver module comprises:
      a first inductor, having a first inductance, electrically coupling the antenna of the first receiver module to the input port of the first receiver module; and
      a capacitor electrically coupling the first inductor to an electrical ground, wherein the control input of the first receiver module is electrically coupled between the first inductor and the capacitor; and
   the control network of the first receiver module comprises a second inductor, having a second inductance, wherein the control network of the first receiver module is electrically coupled to the control input via the second inductor.

4. The RF power receiver of claim 3, wherein the second inductance is substantially greater than the first inductance.

5. The RF power receiver of claim 1, wherein the set of rectifiers comprises a plurality of rectifiers.

6. The RF power receiver of claim 5, wherein the plurality of rectifiers comprises, for each receiver module of the plurality of receiver modules, a respective rectifier that electrically couples the transmitted port of the receiver module to the DC impedance converter.

7. The RF power receiver of claim 1, wherein each rectifier of the set comprises a respective rectifier output, wherein the DC impedance converter comprises:
   a DC impedance converter input electrically coupled to the respective rectifier output of each rectifier of the set;
   a first buck-boost converter;
   a discontinuous conduction mode maintenance control electrically coupled to the first buck-boost converter;
   a second buck-boost converter;
   a feedback control electrically coupled to the second buck-boost converter; and
   a DC impedance converter output electrically coupled to the DC impedance converter input via the first and second buck-boost converters.

8. The RF power receiver of claim 7, further comprising an electrical load electrically coupled, via the set of rectifiers and the DC impedance converter output, to the respective transmitted port of each receiver module of the plurality of receiver modules.

9. The RF power receiver of claim 1, wherein, for each receiver module of the plurality, the control network is further configured to implement a power optimization algorithm to modify the RF input impedance based on the signal.

10. The RF power receiver of claim 1, wherein each rectifier of the set comprises:
a first diode electrically coupling a respective rectifier input to an electrical ground; and
a second diode electrically coupling a respective rectifier output to the electrical ground;
wherein, for each rectifier of the set, the first and second diode cooperatively define an antisymmetric diode pair.

11. The RF power receiver of claim 1, wherein:
the plurality of receiver modules comprises a first plurality of receiver modules and a second plurality of receiver modules, disjoint from the first plurality of receiver modules;
the receiver modules of the first plurality are electrically coupled in series with each other to the DC impedance converter via the set of rectifiers;
the receiver modules of the second plurality are electrically coupled in series with each other to the DC impedance converter via the set of rectifiers; and
the first plurality of receiver modules is electrically coupled to the DC impedance converter in parallel with the second plurality of receiver modules.

12. The RF power receiver of claim 11, wherein the set of rectifiers comprises, for each receiver module of the plurality of receiver modules, a respective rectifier that electrically couples the transmitted port of the receiver module to the DC impedance converter.

13. The RF power receiver of claim 1, wherein, for each receiver module of the plurality, the antenna comprises a respective array of tightly-coupled resonators.

14. The RF power receiver of claim 1, further comprising a wireless communication module configured to communicate power reception information with an RF power transmitter.

15. A method for receiving radio frequency (RF) power at an RF power receiver comprising an antenna, an impedance tuning network, and a power measurement network, the method comprising:
throughout a time interval, at the antenna, receiving RF power;
coupling the RF power from the antenna, via the impedance tuning network, into the power measurement network, wherein the impedance tuning network presents an RF input impedance to the antenna;
during the time interval, at the power measurement network, determining a power coupling metric associated with RF power coupling into the power measurement network;
during the time interval, altering the RF input impedance based on the power coupling metric; and
during the time interval, delivering a portion of the RF power, via the impedance tuning network, to an electrical load.

16. The method of claim 15, further comprising:
throughout the time interval, at an RF power transmitter separate from the RF power receiver, transmitting RF power based on a first transmitter configuration;
at the RF power receiver, after altering the RF input impedance based on the power coupling metric, determining a power reception metric associated with RF power delivery to the electrical load;
based on the power reception metric, determining a second transmitter configuration different from the first transmitter configuration;
in response to determining the second transmitter configuration, at the RF power transmitter, throughout a second time interval after the time interval, transmitting second RF power based on the second transmitter configuration;
throughout the second time interval, at the antenna, receiving a portion of the second RF power; and
during the second time interval, delivering a subportion of the portion of the second RF power, via the impedance tuning network, to the electrical load.

17. The method of claim 16, wherein the power reception metric is determined at the power measurement network.

18. The method of claim 16, wherein:
during the time interval, an RF coupling efficiency via the impedance tuning network increases in response to altering the RF input impedance based on the power coupling metric;
a first power reception efficiency, associated with efficiency of RF power delivery from the RF power transmitter to the electrical load during the time interval after altering the RF input impedance based on the power coupling metric, is less than a second power reception efficiency, associated with efficiency of RF power delivery from the RF power transmitter to the electrical load during the second time interval.

19. The method of claim 16, further comprising, during the second time interval:
at the power measurement network, determining a second power coupling metric associated with RF power coupling into the power measurement network; and
altering the RF input impedance based on the second power coupling metric.

20. The method of claim 19, wherein altering the RF input impedance based on the power coupling metric during the time interval comprises, at the RF power receiver, based on a first set of power coupling metrics determined at the power measurement network during the time interval, performing a first coupling optimization search over an impedance tuning network configuration space, wherein the first set of power coupling metrics comprises the power coupling metric; the method further comprising:
providing a communication indicative of the power reception metric to the RF power transmitter, wherein the RF power transmitter determines the second transmitter configuration based on the communication; and
during the second time interval, at the RF power receiver, based on a second set of power coupling metrics determined at the power measurement network during the second time interval, performing a second coupling optimization search over the impedance tuning network configuration space.

21. The method of claim 20, wherein determining the second transmitter configuration comprises iteratively testing a test series of transmitter configurations during a third time interval between the first and second time intervals, wherein, for each transmitter configuration of the test series, testing the transmitter configuration comprises:
at the RF power transmitter, throughout a respective subinterval of the third time interval, transmitting test RF power based on the transmitter configuration;

at the RF power receiver, during the respective subinterval:
- at the antenna, receiving respective RF power;
- coupling the respective RF power from the antenna, via the impedance tuning network, into the power measurement network;
- performing a respective coupling optimization search over the impedance tuning network configuration space;
- after performing the respective coupling optimization search, determining a respective power reception metric; and
- providing a respective communication indicative of the power reception metric to the RF power transmitter; and if a convergence criterion has not been met:
- at the RF power transmitter, based on the respective communication, selecting an additional transmitter configuration; and
- adding the additional transmitter configuration to the test series.

\* \* \* \* \*